(12) United States Patent
Akimoto et al.

(10) Patent No.: US 6,646,283 B1
(45) Date of Patent: Nov. 11, 2003

(54) SEMICONDUCTOR DEVICE, IMAGE DISPLAY DEVICE, AND METHOD AND APPARATUS FOR MANUFACTURE THEREOF

(75) Inventors: Hajime Akimoto, Ome (JP); Kozo Katayama, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/959,941

(22) PCT Filed: May 14, 1999

(86) PCT No.: PCT/JP99/02518
§ 371 (c)(1),
(2), (4) Date: Nov. 13, 2001

(87) PCT Pub. No.: WO00/70686
PCT Pub. Date: Nov. 23, 2000

(51) Int. Cl.[7] .............................................. H01L 29/786
(52) U.S. Cl. .............................. 257/30; 257/23; 257/24; 257/72; 257/329
(58) Field of Search .............................. 257/30, 23, 24, 257/38, 68, 72, 329

(56) References Cited

U.S. PATENT DOCUMENTS 4,723,837 A * 2/1988 Masubuchi .................. 349/51
6,136,624 A * 10/2000 Kemmochi et al. ......... 438/30

FOREIGN PATENT DOCUMENTS

| JP | 7-153955 | 6/1995 |
| JP | 7-211948 | 8/1995 |
| JP | 10-200001 | 7/1998 |

OTHER PUBLICATIONS

G. Vincent et al., "Electric field effect on the thermal emission of traps in semiconductor junctions", *Journal of Applied Physics*, 50(8), 1979, pp. 5484–5487.

M. Okabe, "Low–temperature Poly–Si TFT–LCDs with Monolithic Drivers", *Proceedings of International Display Workshop*, 1996, pp 5–8.

* cited by examiner

Primary Examiner—Jerome Jackson
(74) Attorney, Agent, or Firm—Miles & Stockbridge P.C.

(57) ABSTRACT

A switch device includes a source, a drain, and a gate electrode which are conductive, one or more semiconductor island layer(s) formed between the source and drain, an insulating film between the source and island layer, an insulating film between the drain and island layer, an insulating layer between island layers if a plurality of island layers are provided, and a gate capacitor formed by the gate electrode, at least one island layer, and a gate insulating film provided between the gate electrode and the island layer. The electric field applied to the gate capacitor is set to be substantially parallel with a channel current flowing via the island between the source and the drain.

13 Claims, 12 Drawing Sheets

POTENTIAL, $\phi$

SEMICONDUCTOR DEVICE, IMAGE DISPLAY DEVICE, AND METHOD AND APPARATUS FOR MANUFACTURE THEREOF

TECHNICAL FIELD

The present invention relates to a semiconductor device, an image display device, and method and apparatus for manufacturing the image display device and relates to a technique effective for use in a device having a switching device in which a leak current in an off state is reduced.

BACKGROUND ART

FIG. 15 shows an example of a pixel configuration in a TFT (Thin-Film-Transistor) liquid crystal panel according to a conventional technique. Each pixel is constructed by a pixel switch 101, a liquid-crystal capacitor 102, and a load capacitor 103. One end of the pixel switch 101 is connected in parallel with the liquid-crystal capacitor 102 and the load capacitor 103. The other end of the pixel switch 101 is connected to a signal-line driving circuit 107 via a signal line 106. The gate of the pixel switch 101 is connected to a gate-line driving circuit 108 via a gate line 104. The other end of the load capacitor 103 is connected to a load capacitor line 105. Although not shown, pixels are arranged in a matrix on a panel, the signal line 106 is connected commonly to pixels in the column direction, and the gate line 104 and the load capacitor line 105 are connected commonly to pixels in the row direction.

In FIG. 15, at the beginning of a horizontal scanning period, a pixel row to which a display signal is to be written is selected in a predetermined order by the gate-line driving circuit 108, and the pixel switch 101 of this row is set in the on state. Subsequently, the signal-line driving circuit supplies the write signal to each of the pixels in the selected row to the liquid-crystal capacitor 102 and the load capacitor 103 via the signal line 106 and the pixel switch 101. At the end of the horizontal scanning period, the gate-line driving circuit 108 sets the pixel switch 101 of the row into the off state, thereby finishing the writing operation on the pixels of one row.

FIG. 16 is a sectional structural diagram of a polycrystal TFT as a component of the pixel switch 101. The channel portion is constructed by a poly-Si thin film. On the poly-Si thin film, a gate electrode 112 is provided via a gate insulating film 115. A source 110 and a drain 111 are formed by doping an n-type high-concentration impurity into the poly-Si thin film. Further, n-regions 113 and 114 for electric field reduction are provided so as to be self-aligned with the gate insulating film 115.

FIG. 17 shows the current-voltage characteristics of the polycrystal TFT as a component of the pixel switch 101. When a gate voltage Vgs becomes negative and the pixel switch 101 is turned off, it is ideal that a current Ids becomes 0. However, in reality, as the gate voltage Vgs increases on the negative side, the off characteristic of the polycrystal TFT indicates an increase tendency as shown by the arrow in FIG. 17. This is caused by thermal carrier emission from defect-induced states in the poly-Si film and occurrence of a leak current by tunneling. The details of such a leak current are described in, for example, "Journal of Applied Physics", 50(8), pp. 5484–5487 (1979).

In the case where the leak current cannot be ignored, a signal charge written in the liquid-crystal capacitor 102 flows out from the pixel switch 101, so that deterioration occurs in a displayed image due to flicker noise or the like. The purpose of providing the n-regions 113 and 114 for electric field reduction in the pixel switch 101 is to reduce the leak current. Further, the purpose of providing the load capacitor 103 for a pixel is to suppress the influence of the leak current by increasing the amount of charges written into the pixel.

Such a conventional technique is described in, for example, "Proceedings of International Display Workshop '96 (IDW'96)", pp. 5–8 (1996).

In order to reduce the influence of the leak current of the pixel switch 101 to a level at which the influence can be ignored, employment of only the n-regions 113 and 114 is insufficient, and the load capacitor 103 has to be formed. However, when the pixel size decreases as the liquid crystal panel is becoming more precise, by providing the load capacitor 103, the fill-factor of pixels deteriorates, and a problem such that the brightness of the screen is reduced occurs.

It is therefore an object of the invention to provide a semiconductor device having a high-performance novel switching device in which a leak current in an off state is reduced. Another object is to provide an image display device realizing higher definition by using the switch device. Further another object is to provide method and apparatus for manufacturing a semiconductor device including the switch device and a semiconductor device suitable for forming the image display device. The above and other objects and novel features of the invention will become apparent from the description of the specification and the appended drawings.

DISCLOSURE OF THE INVENTION

Outline of a representative embodiment of the invention disclosed in the specification will be briefly described as follows. A switch device includes conductive source, drain, and gate electrode, one or more semiconductor island layer (s) formed between the source and drain, an insulating film between the source and island layer, an insulating film between the drain and island layer, an insulating layer between island layers if a plurality of island layers are provided, and a gate capacitor formed by the gate electrode, at least one island layer, and a gate insulating film provided between the gate electrode and the island layer. The electric field applied to the gate capacitor is set to be substantially parallel with a channel current flowing via the island between the source and the drain.

BEST MODE FOR CARRYING OUT THE INVENTION

The invention will be described in more detail with reference to the appended drawings.

Figure 1:
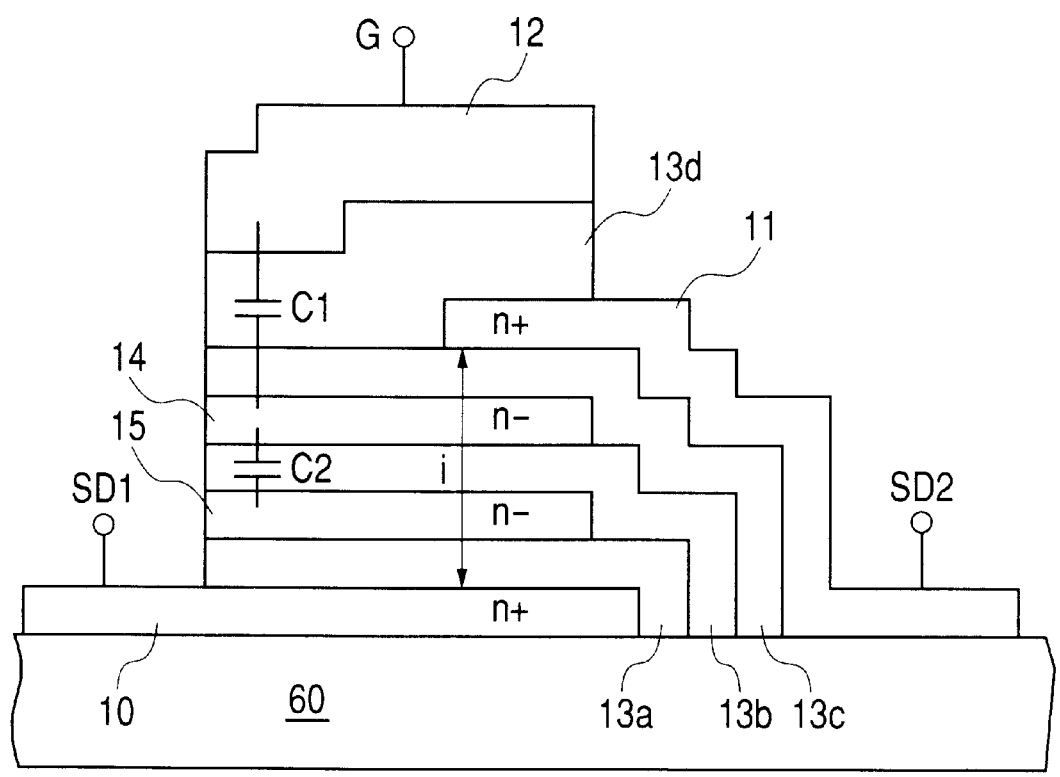
FIG. 1 is a sectional structural diagram showing an example of a switch device according to the invention.

FIG. 1 is a schematic sectional structural diagram showing an example of a switch device according to the invention. The channel portion is constructed by poly-Si islands 14 and 15. An island denotes an island-shaped layer isolated from other semiconductor layers and the like by an insulating film and is a term generally used in, particularly, a TFT liquid crystal display panel and the like. A source 10 and a drain 11 of the switch device are formed by doping phosphorus as an n-type high-concentration impurity into the poly-Si thin film. In the switch device according to the invention similar to an MOS structure, a current is passed bidirectionally as in a known MOS transistor or TFT. The source and the drain of the switch device are therefore determined according to the application direction of the voltage. In the specification, for convenience, the lower conductive layer is called a source (SD1) 10 and the upper conductive layer is called a drain (SD2) 11.

Between the source 10 and the poly-Si island 15, an insulating film 13a is formed. Between the poly-Si islands 15 and 14, an insulating film 13b is formed. Between the poly-Si island 14 and the drain 11, an insulating film 13c is formed. Further, on the poly-Si island 14, although not limited, a gate electrode (G) 12 is provided via the insulating film 13c and a gate insulating film 13d. The switch device is formed on the surface of a flat substrate 60 which is a proper semiconductor substrate or insulating substrate.

Figure 2A:
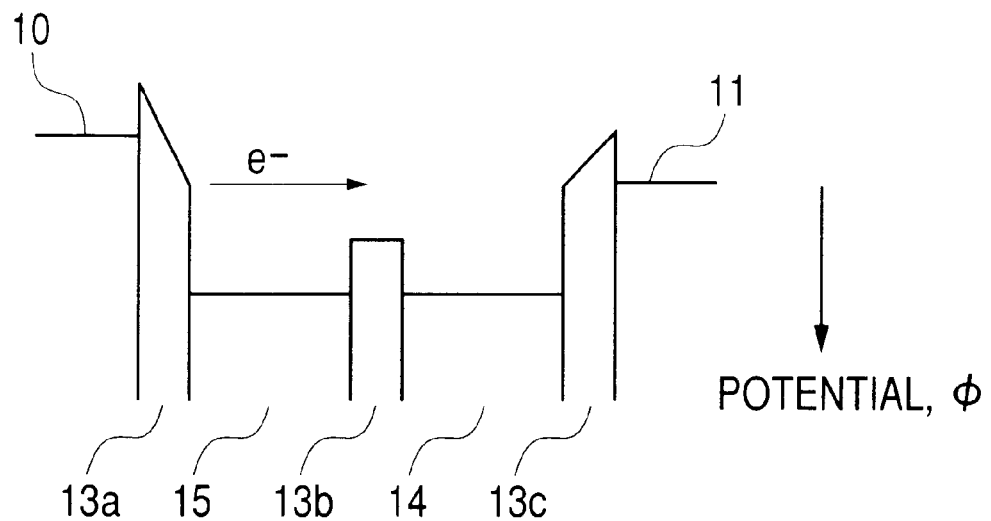
FIGS. 2A and 2B are diagrams for explaining the operation of the switch device shown in FIG. 1.
Figure 2B:
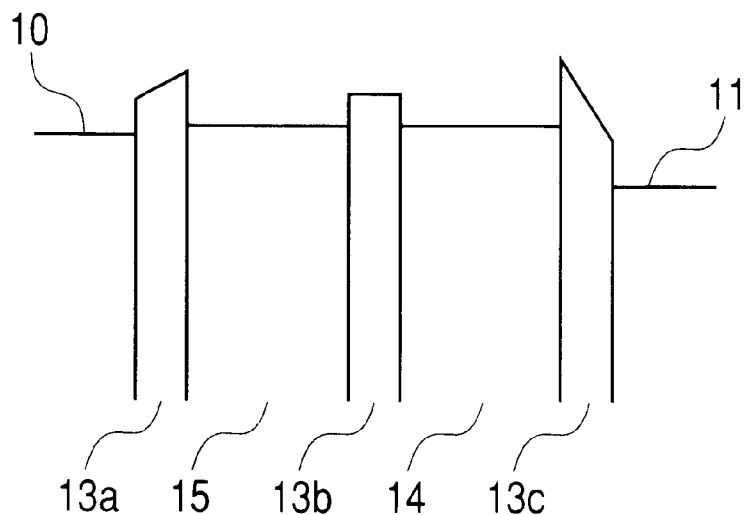

The operation of the switch device will be described hereinbelow by referring to FIGS. 2A and 2B. FIGS. 2A and 2B are diagrams showing potentials of the source 10, poly-Si islands 15 and 14, and drain 11. The potential increases with a distance from the upper side as shown by the arrow. FIG. 2A corresponds to a gate on state, and FIG. 2B corresponds to a gate off state.

When a proper first voltage is applied to the gate electrode 12 and the gate electrode 12 enters the on state shown in FIG. 2A, the potential in the poly-Si island 14 increases by capacitive coupling between the gate electrode 12 and a parasitic capacitance C1 also shown in FIG. 1 and, further, the potential of the poly-Si island 15 also increases by capacitive coupling of a parasite capacitance C2 between the poly-Si islands 14 and 15. Since each of the insulating film 13a and 13c is set to 3 nm in which a tunneling current occurs and each of the poly-Si islands 15 and 14 is set to 5 nm smaller than an electron mean-free-path, electrons charged in the poly-Si island 15 from the source 10 pass through the central insulating film 13b of which potential is increased and flows in the drain 11 while the electrons are hardly scattered. When the potential in the source 10 and that in drain 11 finally become equal to each other, the channel current reaches equilibrium and the channel current seemingly stops. Since the thickness of the gate insulating film 13d is 20 nm and is relatively large, generation of the gate current can be almost ignored.

Subsequently, when a second voltage is applied to the gate electrode 12 and the gate electrode 12 enters an off state shown in FIG. 2B, the potential in the poly-Si islands 15 and 14 decreases due to capacitive coupling with the gate electrode 12. When seen from the source 10, a plurality of tunnel barriers including the insulating film 13b in the center are generated in the channel. In this case, by the effect of the plurality of tunnel barriers, the leak current between the source 10 and the drain 11 can be reduced to an extremely small value.

Refer to Japanese Unexamined Patent Application Publication (JP-A) No. 10-200001 for the details of the basic operation principle of the switch device, that is, the operation principle such that the potential of the poly-Si islands 15 and 14 is changed by the gate electrode and the channel current is switched by using the poly-Si islands 15 and 14 as channels.

The switch device of the example is devised by forming the gate electrode so that the gate capacitance becomes substantially parallel with the channel current flowing between the source and drain via the islands. The switch device of the example is substantially different from the invention of JP-A-10-200001 with respect to a point that the TFT operation can be realized without performing a fine photoresist etching process, a point that a heavy current can be obtained by controlling the potential of the whole poly-Si island by the capacitive coupling with the gate, and the like.

Specifically, in the case of using the switch device also as a pixel switch of a TFT liquid crystal panel as will be described herein later, when a device is formed on a silicon substrate as a precondition like JP-A-10-200001, due to large substrate dimension, the device process on the large-size TFT liquid crystal panel with fine photoresist etching as in the case using the silicon substrate is substantially impossible. Consequently, the device structure as in the invention considering that point as well is extremely useful.

Figure 3:
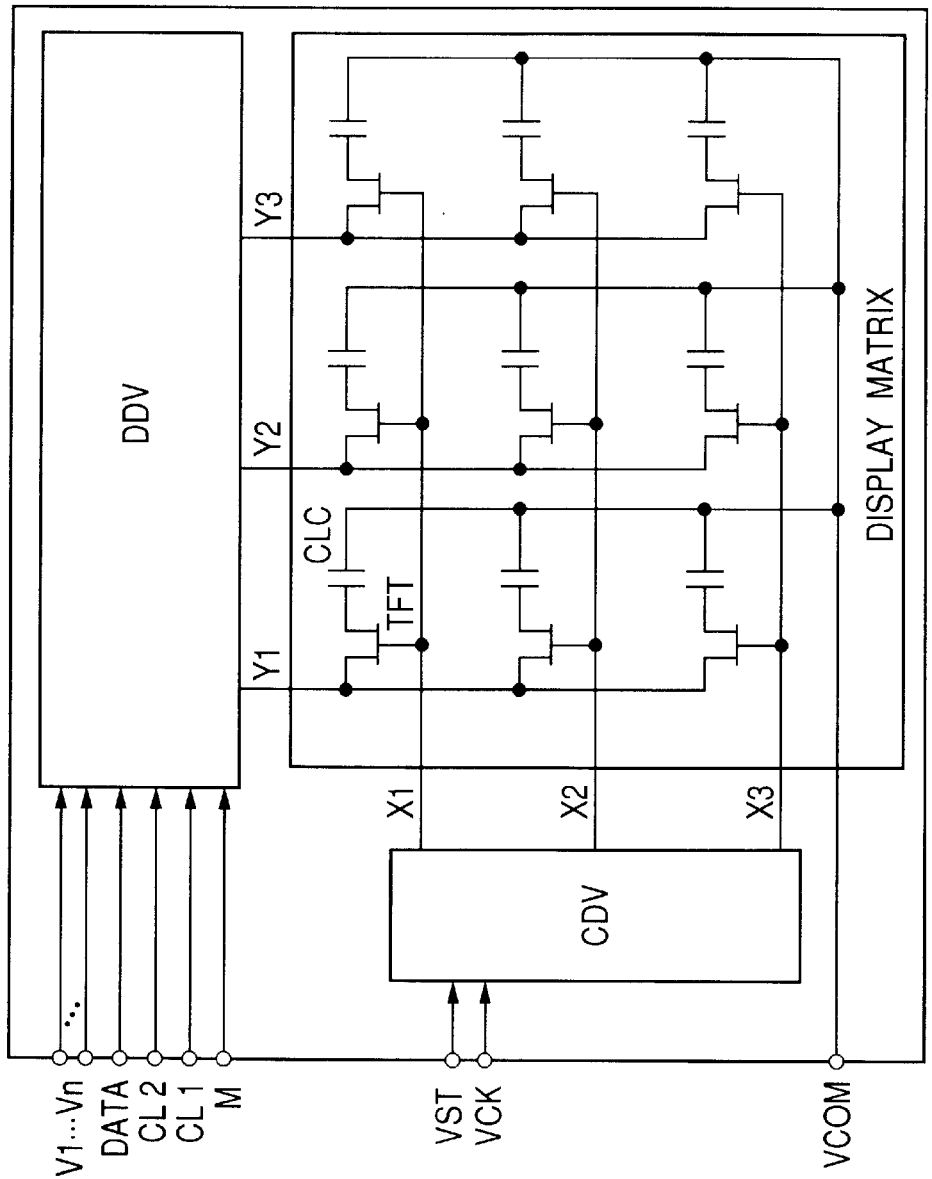
FIG. 3 is a block diagram showing an example of an image display device constructed by using the switch device according to the invention.

FIG. 3 is a block diagram showing an example of an image display device constructed by using the switch device according to the invention. The diagram shows an example of the pixel configuration of a TFT liquid crystal panel. In broad outline, the switch device according to the invention is used as a pixel switch (hereinbelow, called a TFT) and each pixel is constructed by the TFT and a liquid-crystal capacitor CLC. One end of the pixel switch TFT is connected to a pixel electrode of the liquid-crystal capacitor CLC, and the other end is connected to a signal-line driving circuit DDV via a signal line Y1, and the gate of the pixel switch TFT is connected to a gate-line (scanning line) driving circuit CDV via a scanning line X1. In the diagram, three signal lines Y1 to Y3, three scanning lines X1 to X3, and pixel cells provided at the intersecting points of the signal lines Y1 to Y3 and the three scanning lines X1 to X3 and each constructed by the pixel switch TFT and the liquid crystal capacitor CLC are illustrated representatively. The circuits are formed on a single glass substrate.

The signal line electrodes Y1 to Y3 of the liquid crystal display panel are driven by the display driver (signal line driving circuit) DDV. Each of the signal line electrodes Y1 to Y3 is connected to one of sources and drain of the pixel switch TFT. The liquid crystal capacitor CLC as a pixel is connected to the other source and drain of the pixel switch TFT.

The gate line (scanning line) electrodes X1 to X3 to which gates of the pixel switches TFT are connected are connected to the scanning line driving circuit CDV. The scanning line driving circuit CDV sequentially selects the scanning line electrodes X1 to X3 synchronously with a timing signal CL1. When the scanning line electrode X1 is set to the high level, the pixel switch TFT in the first row is turned on, and a display signal corresponding to a signal-stepping voltage output from the signal line electrodes Y1 to Y3 is held in the liquid-crystal capacitor CLC.

After that, the scanning line electrodes X2 and X3 are sequentially selected and, synchronously with the selecting operation, a display signal as described above is output from the display driver DDV and held in each liquid crystal capacitor CLC. The vertical shift clock VCK is synchronized with the timing signal CL1. To a common electrode COM of the liquid crystal display panel, a bias voltage VCOM is supplied.

The signal-line driving circuit DDV is provided with a voltage follower circuit to which signal-stepping voltages such as V1 to Vn (V1+, V1-, V2+, V2-, ..., Vn+, Vn-) are supplied. The signal-line driving circuit DDV decodes pixel data DATA input synchronously with a timing signal CL2, selects a signal-stepping voltage output from the voltage follower circuit in correspondence with pixel data, and outputs the selected signal-stepping voltage to the signal lines Y1 to Y3.

The signal line driving circuit DDV may receive a serial analog signal or a display signal in the form of the signal-stepping voltage, sequentially select the signal lines Y1 to Y3, and sequentially write the display signal to the pixels selected by the scanning line X1. In other words, in a manner similar to a raster scanning operation of a CRT, display signals serially input may be written in corresponding liquid crystal pixels in a time sequential matter.

An AC-driving signal M is used to reverse the polarities of the write voltages so as to prevent application of a direct current to the liquid crystal pixel. Specifically, when a display operation of one screen is finished, the polarities of voltages written in the liquid crystal pixel are reversed by the AC-driving signal M around the common voltage VCOM as a center, thereby AC-driving the liquid crystal as a whole. For example, in the first display period (frame), a negative voltage is supplied to liquid crystals corresponding to odd-numbered scanning lines, and a positive voltage is supplied to liquid crystals corresponding to even-numbered scanning lines. In the next frame, in contrast to the above, the positive voltage is supplied to the liquid crystals corresponding to the odd-numbered scanning lines and the negative voltage is supplied to liquid crystals corresponding to the even-numbered scanning lines.

Figure 4:
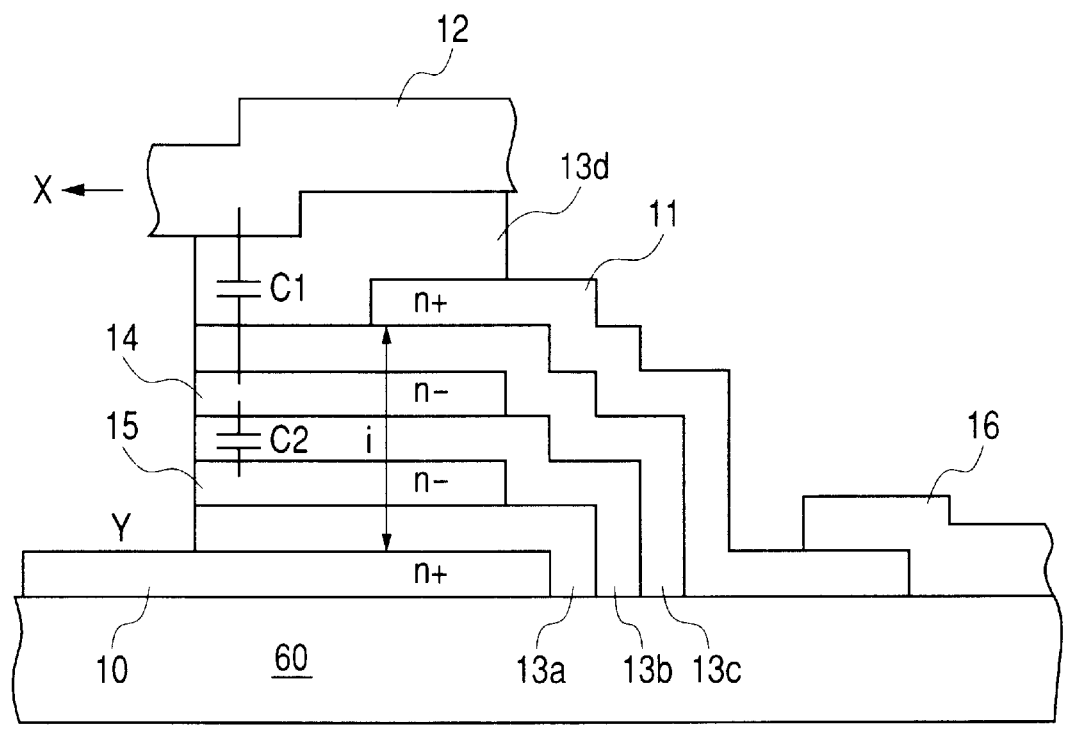
FIG. 4 is a schematic cross section of a pixel cell in the image display device.

FIG. 4 is a schematic cross section showing an example of a pixel cell in the image display device. As the pixel switch, the switch device shown in FIG. 1 is used as it is. In the example, the conductive layer 10 described as the source is used as the signal line Y and extends in the direction perpendicular to the face of the drawing sheet. The gate electrode 12 is used as the scanning line X and extends in the lateral direction of the drawing. The conductive layer 11 described as the drain is connected to a liquid crystal pixel electrode 16. The pixel electrode is formed by an ITO film as a transparent electrode.

In the liquid crystal display panel, although not limited, an upper transparent glass substrate (not shown) is provided so as to face the glass substrate on which the pixel switch (TFT) and the pixel electrode 16 are provided. On the upper transparent glass substrate, a color filter, a black matrix pattern for optical shield, and a common electrode are formed.

Although not limited, on the surface of each of the upper and lower glass substrates, a silicon oxide film is formed by a dipping process or the like. Consequently, even if there is a sharp scratch in the surface of the transparent glass substrate, it can be covered with the silicon oxide film, so that a signal line electrode, a shield film, and the like deposited on the surface can be maintained uniform.

Figure 5:
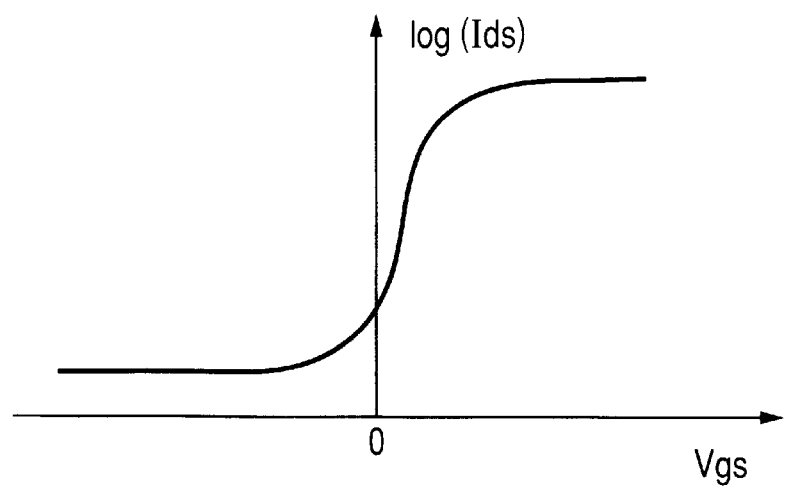
FIG. 5 is a current-voltage characteristic diagram of a pixel switching device used for the pixel cell.

FIG. 5 shows the current-voltage characteristics of the pixel switch. By using the switch device according to the invention as the above-described pixel switch, when the gate voltage becomes negative and the pixel switch TFT is turned off, the current becomes almost zero. As shown in FIG. 3, therefore, in the example, even if a load capacitor is not provided for the pixel, deterioration in a display image due to flicker noise or the like caused by a leak current in the pixel switch does not occur.

By the effect, in the image display device of the example, even when the pixel size is reduced as the resolution of the liquid crystal panel becomes higher, a problem such that the fill-factor of pixels decreases due to the existence of the load capacitor and the brightness of the screen decreases does not occur. Thus, the image displaying operation can be realized with high definition and high quality.

In the example, in order to reduce the resistance value in the switch device, an n-type impurity is lightly doped in the poly-Si islands 14 and 15. However, when the concentration of the n-type impurity is increased too much, the mean-free-path of an electron in the poly-Si islands becomes shorter, and it causes decrease in an on-current. Therefore, the concentration of the n-type impurity has to be set to $10^{16}$ $cm^{-3}$ or lower.

Although the operation speed margin of the switch will be narrowed, the poly-Si islands 14 and 15 can be made of what is called i-type poly-Si. In the invention, in theory, the poly-Si island can be replaced with a single crystal Si island having a low impurity concentration.

In the liquid crystal display panel, it is also possible to form the pixel switch (TFT), the pixel electrode 16, a common electrode formed while sandwiching a liquid crystal, a color filter, and the like on a single glass substrate.

The pixel switch has been mainly described above. The image display device of the example is realized by, but not limited, constructing the scanning-line driving circuit CVD and the signal line driving circuit DDV by a poly-Si LSI chip and mounting the resultant on the glass substrate 60.

Figure 6:
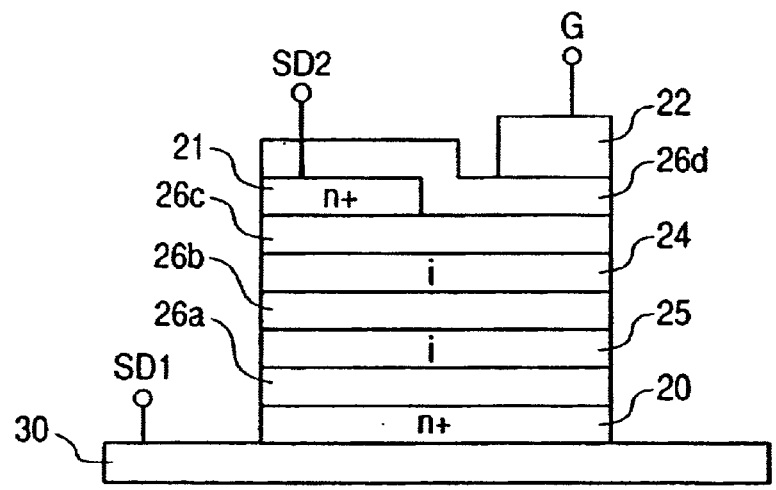
FIG. 6 is a sectional structural diagram showing another example of the pixel switch used for the image display device.

FIG. 6 is a sectional structural diagram showing another example of the pixel switch used in the image display device. A source 20 formed by doping phosphorus as an n-type high-concentration impurity into the poly-Si thin film is provided on a source leading electrode 30. On the source 20, an insulating film 26a, a poly-Si island 25, an insulating film 26b, a poly-Si island 24, an insulating film 26c, and a drain 21 formed by doping phosphorus as an n-type high-concentration impurity into the poly-Si thin film are sequentially formed. On the insulating film 26c and the drain 21, a gate electrode 22 is provided via a gate insulating film 26d. Since the operation of the pixel switch is similar to that already described in the example of FIG. 1, its description will not be repeated.

Figure 7A:
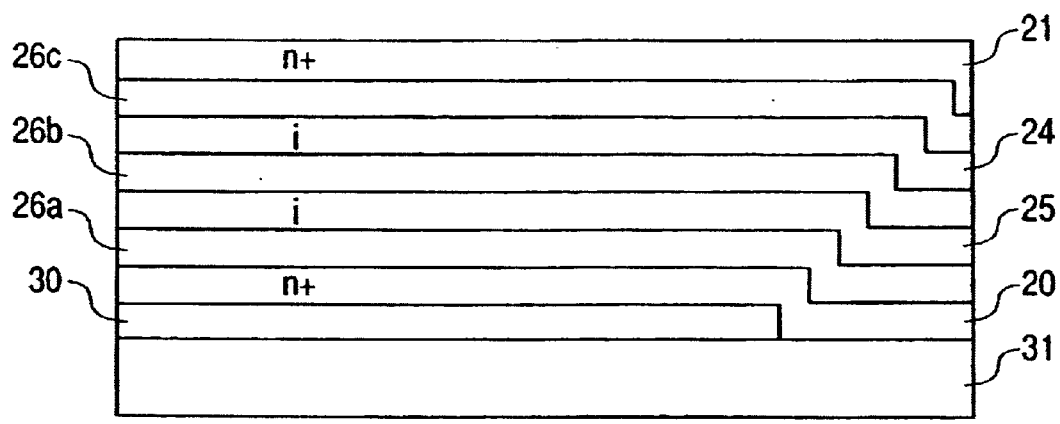
FIGS. 7A and 7B are diagrams for explaining a method of manufacturing the pixel switch shown in FIG. 6.
Figure 7B:
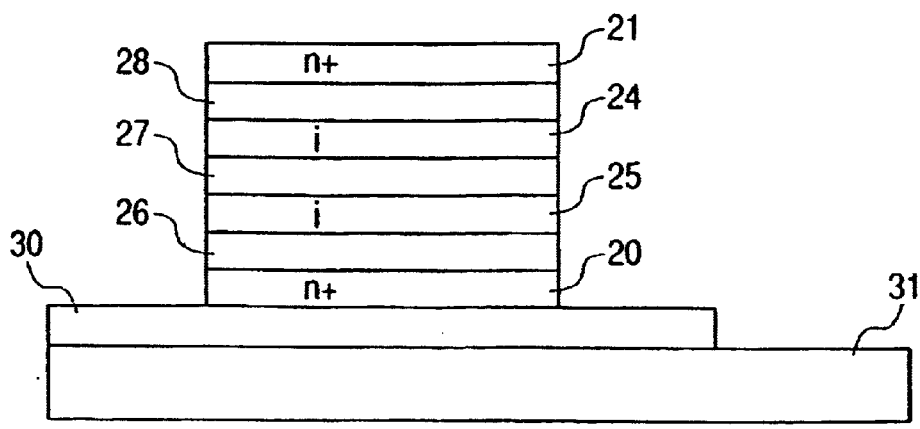

FIGS. 7A and 7B are explanatory diagrams for explaining a method of manufacturing the pixel switch shown in FIG. 6. First, on a glass substrate 31 as an insulating substrate, the source leading electrode 30 is processed. On the source leading electrode 30, the poly-Si thin film layer in which phosphorus as an n-type high-concentration impurity is doped is formed in thickness of 50 nm by CVD. Subsequently, an Si3N4 insulating layer 26 is similarly formed in 5 nm by CVD, and an amorphous Si layer is formed in 10 nm by CVD. The amorphous Si layer is irradiated with a high-energy excimer-laser beam to be converted to the poly-Si thin film layer 25.

In a manner similar to the above, an Si3N4 insulating layer of 5 nm and, further, the poly-Si thin film layer 24 of 10 nm are formed. Subsequently, an Si3N4 insulating layer 28 of 5 nm and the poly-Si thin film layer 21 of 50 nm in which phosphorus as an n-type high-concentration impurity is doped are formed. The resultant is shown in FIG. 7A.

FIG. 7B shows a state where the multilayer film is patterned in a lump by dry etching using a photoresist process to thereby form a channel region in the pixel switch 1. In the structure, a part of the n-type high-concentration poly-Si thin film layer 21 is etched, thereby forming the SiO2 gate insulating film 26d of 10 nm and a gate electrode 22. In such a manner, the pixel switch structure shown in FIG. 6 is completed. Although not shown, formation of a protective film, wiring, and the like are subsequently conducted.

In order to avoid deterioration in control of film quality due to formation of a natural oxide film on the surface of each of the films, in the invention, the multilayer film is devised to be formed in successive processes as will be described hereinbelow.

Figure 8:
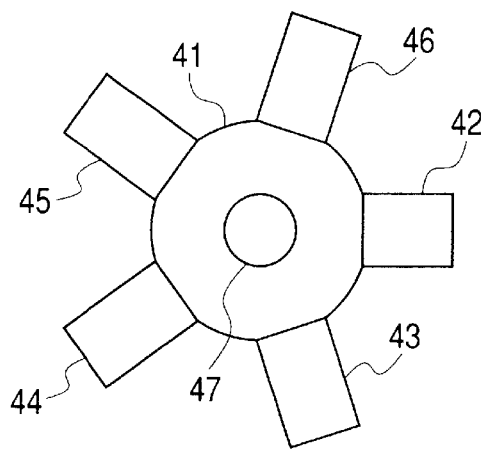
FIG. 8 is a diagram showing the configuration of an apparatus for manufacturing an image display device including the pixel switch illustrated in FIG. 6.

FIG. 8 is a diagram showing the configuration of an apparatus for manufacturing an image display device including the pixel switch illustrated in FIG. 6. A vacuum chamber body 41 is provided with a CVD system 43 for the poly-Si film in which phosphorus as an n-type high-concentration impurity is doped, a CVD system 44 for the amorphous Si film, a high-energy excimer-laser exposure-instrument 45, a CVD system 46 for the Si3N4 insulating film, and a glass substrate loading port 42. In the center of the systems, a substrate carrier 47 is provided. Concretely, the substrate carrier 47 is substantially operated in vacuum. By employing the apparatus, formation of the multilayer film is made possible while avoiding generation of a natural oxide film and an influence of a foreign matter in the air.

By employing the manufacturing the method using such a manufacturing apparatus, formation of a natural oxide film and invasion of a foreign matter on/in the very thin insulating film and the island layer can be prevented. Thus, a desired current in the on state can be obtained, and an ideal switch device in which a leak current is hardly passed in the off state can be formed. Moreover, in formation of the small electric element on a large substrate like a liquid crystal display panel as compared with the semiconductor wafer, since the influence of adhesion of a foreign matter in the air or the like is great, the manufacturing apparatus and method are extremely useful.

In the embodiment, the poly-Si island layer is formed by crystallizing the amorphous Si film with the high-energy excimer laser beam. Consequently, the excellent polycrystal film having extremely low defect-induced-state density can be used for a poly-Si island, and the pixel switch having a low on-state resistance between the source and drain can be formed.

In the foregoing example, the source 20 and drain 21 are formed by a poly-Si film in which phosphorus as an n-type high-concentration impurity is doped. Alternately, a metal layer may be used. What is called i-type poly-Si having an impurity concentration in the poly-Si island lower than the defect-induced-state density is used. As described above, it is also possible to use a low-concentration p-type or n-type impurity although the mean-free-path of electrons decreases.

Although Si3N4 is used for the insulating film between the poly-Si islands, an effect similar to that in the embodiment can be also obtained in theory with another insulating film made of SiO2 or the like. In the example, an n-type device using the n-type high-concentration poly-Si thin film layers 20 and 21 is employed. Alternately, although the voltages are reversed, a p-type device using p-type high-concentration poly-Si thin film layers 20 and 21 can be employed.

Although the multilayer film forming apparatus shown in FIG. 8 carries the substrate in vacuum between the film forming systems, it is also possible to charge N2 or another inert gas into the chamber 41 and carry the substrate in such an atmosphere.

Figure 9A:
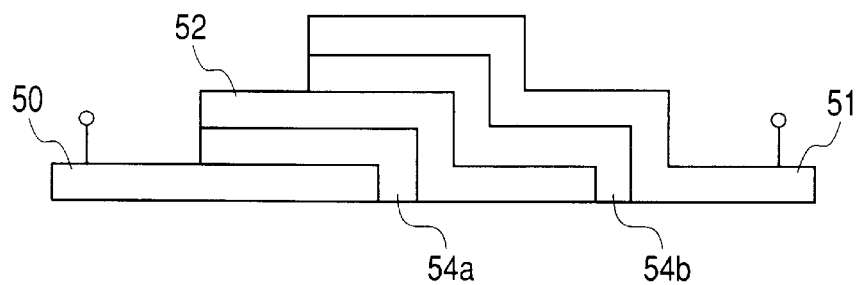
FIGS. 9A and 9B are diagrams for explaining another example of the pixel switch according to the invention.
Figure 9B:

FIGS. 9A and 9B are diagrams for explaining another example of the pixel switch according to the invention. FIG. 9A is a sectional structural diagram of a transistor device as a component of the pixel switch. FIG. 9B is a plan view of the transistor device. On a source 50 obtained by doping phosphorus as an n-type high-concentration impurity into the poly-Si thin film, an Si3N4 insulating film 54a, a poly-Si island 52, an Si3N4 insulating film 54b, and a drain 51 obtained by doping phosphorus as an n-type high-concentration impurity into the poly-Si thin film are sequentially formed. As shown in FIG. 9B, the poly-Si island 52 extends in the lateral direction so as to be deviated from the source 50 and the drain 51. On the poly-Si island 52, a gate electrode 53 is provided via an SiO2 gate insulating film (not shown).

Figure 10A:
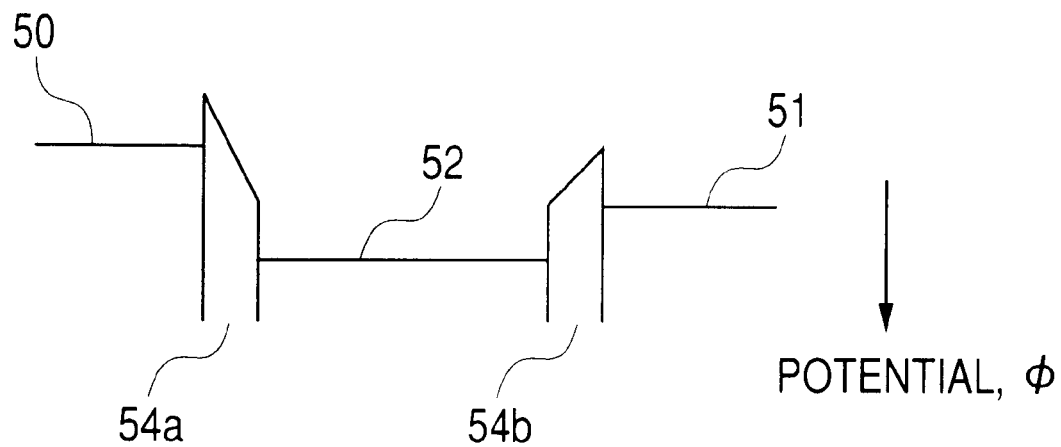
FIGS. 10A and 10B are diagrams for explaining the operation of the pixel switch shown in FIGS. 9A and 9B.
Figure 10B:
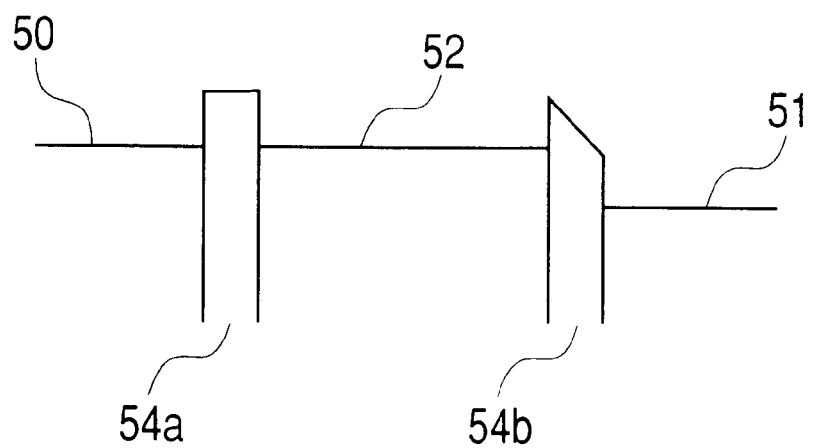

FIGS. 10A and 10B are diagrams for explaining the operation of the pixel switch illustrated in FIGS. 9A and 9B. FIGS. 10A and 10B show potentials in the source 50, poly-Si island 52, and drain 51. FIG. 10A corresponds to a state where the gate is on. FIG. 10B corresponds to a state where the gate is off.

By applying a predetermined first voltage to the gate electrode 53, the gate electrode 53 enters the on state. As shown in FIG. 10A, the potential of the poly-Si island 52 decreases due to capacitive coupling with the gate electrode 53. Since the insulating film 54 is set to 3 nm in which a tunneling current occurs and the poly-Si island 52 is set to 5 nm smaller than the mean-free-path of an electron. The electrons injected from the source 50 to the poly-Si island 52 flows into the drain 51 almost without being scattered. When the potential of the source 50 and that of the drain 51 become equal to each other, the channel current reaches equilibrium, and a seeming channel current is stopped.

Subsequently, by applying a predetermined second voltage to the gate electrode 53, the off state is obtained. As shown in FIG. 10B, the potential in the poly-Si island 52 increases by the capacitive coupling with the gate electrode 53. When seen from the source 50, a potential barrier is generated by the poly-Si island 52. In this case, by the potential barrier, the leak current between the source 50 and the drain 51 can be reduced to an extremely small value.

Although the gate electrode 53 is provided on the poly-Si island 52 via the gate insulating film in the example, also by providing the gate electrode 53 under the poly-Si island 52 via the gate insulating film, the characteristics of the switch do not change basically.

Figure 11:
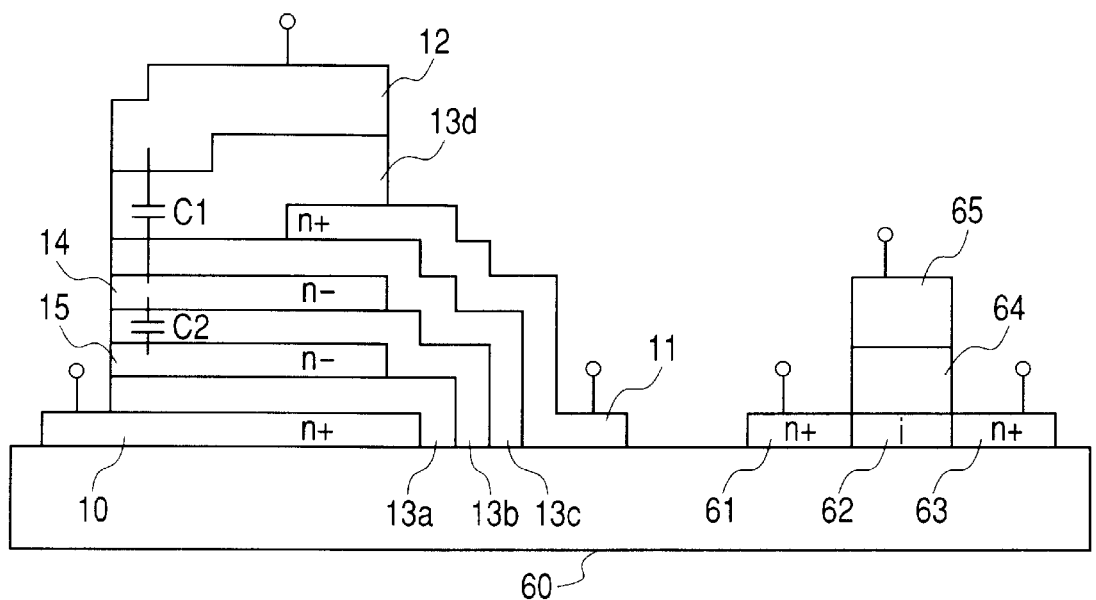
FIG. 11 is a sectional structural diagram showing an example of a pixel switch for use in the image display device and a device as a component of a gate-line driving circuit and a signal-line driving circuit.

FIG. 11 is a sectional structural diagram showing an example of a pixel switch for use in the image display device and a device as a component of a gate-line driving circuit and a signal-line driving circuit. Since the configuration and operation of a TFT (Thin-Film-Transistor) liquid crystal panel in the example are basically the same as those in the foregoing example, their description will not be repeated here.

The difference of the example of FIG. 11 from the foregoing example is that the gate-line driving circuit CDV and the signal-line driving circuit DDV are constructed by using a poly-Si TFT provided on the same glass substrate 60. It will be described by referring to FIG. 11.

FIG. 11 is a cross section illustrating the pixel switch and a poly-Si TFT as a representative component of the gate-line driving circuit CDV and the signal line driving circuit DDV provided on the glass substrate 60. Although the pixel switch and the poly-Si TFT are not always provided adjacent to each other, for convenience of explanation, they are arranged adjacent to each other. Since the configuration of the pixel switch has already been described in the foregoing example, the corresponding components are designated by the same reference numerals as those in the foregoing example and their description will not be repeated.

The poly-Si TFT is constructed by a source 61 obtained by doping an n-type impurity into a poly-Si thin film having a thickness of 50 nm, a drain 63, a channel region 62 of what is called an i-type in which no impurity is doped, a gate insulating film 64 having a thickness of 20 nm, and a gate electrode 65.

The poly-Si thin film constructing the source 61, drain 63, and channel region 62 of the Si-TFT is fabricated in the same process as the poly-Si thin film constructing the drain 11 in the pixel switch. Similarly, the gate insulating film 64 is formed in the same process as the gate insulating film 13d, and the gate electrode 65 is formed in the same process as the gate electrode 12.

Although the poly-Si TFT shown in FIG. 11 is of the n-type, in practice, a poly-Si TFT of the p-type having the same structure is also provided on the same glass substrate 60 as a component of a CMOS circuit. However, it is not shown here for simplicity of the drawing.

By using the configuration of the example, the liquid crystal TFT panel can be easily realized without mounting an Si-LSI as a component of the gate-line driving circuit CDV and the signal-line driving circuit DDV as described above. In particular, this is a great advantage in manufacture of a high-resolution TFT panel, in which it is difficult to mount an Si-LSI.

Figure 12:
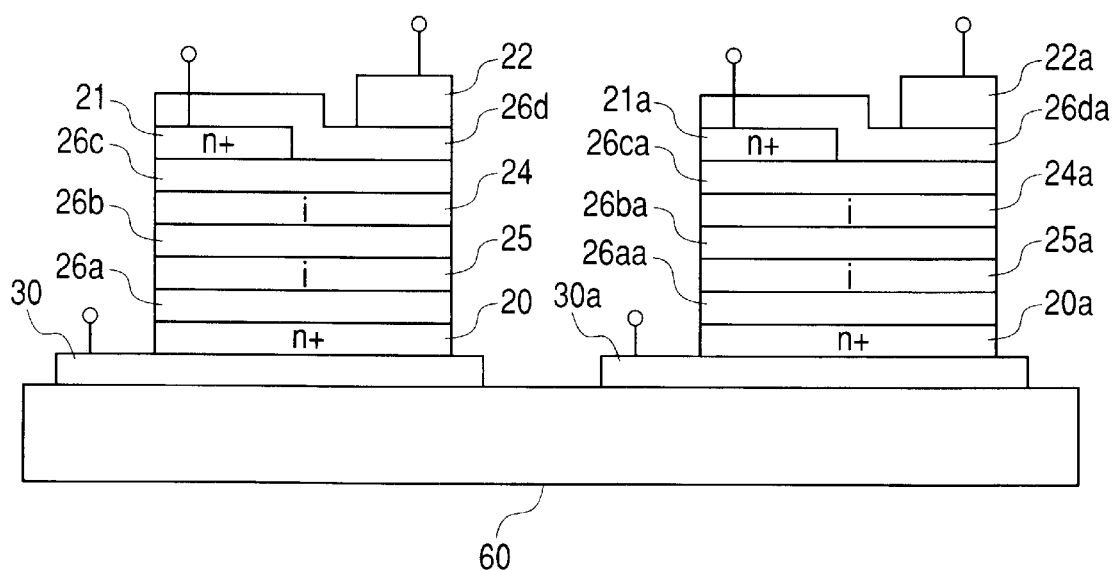
FIG. 12 is a sectional structural diagram showing another example of a pixel switch for use in the image display device and a device as a component of a gate-line driving circuit and a signal-line driving circuit.

FIG. 12 is a sectional structural diagram showing another example of a pixel switch for use in the image display device and a device as a component of the gate-line driving circuit and the signal-line driving circuit. Since the configuration and operation of a TFT liquid crystal panel in the example are basically the same as those in the foregoing example, their description will not be repeated here.

The difference of this example from the foregoing example is that the gate-line driving circuit CDV and the signal-line driving circuit DDV are constructed by using the same device as the pixel switch provided on the same glass substrate 60. It will be described by referring to FIG. 12.

FIG. 12 is a cross section illustrating a pixel switch similar to that shown in FIG. 6 provided on the glass substrate 60 and a switch device having the same configuration as a component of the gate-line driving circuit CDV and the signal line driving circuit DDV. Although the pixel switch and the switch device are not always provided adjacent to each other, for convenience of explanation, they are arranged adjacent to each other. Since the configuration of the pixel switch has already been described in the foregoing example, the corresponding components are designated by the same reference numerals as those in the foregoing embodiment and their description will not be repeated.

Since the structure and operation of the switch device having the same structure as that as a component of the gate-line driving circuit CVD and the signal-line driving circuit DDV are the same as those of the above-described device, each of components corresponding to those in the above device is designated by the same reference numeral with "a", and the description will not be repeated.

Obviously, both the devices can be formed simultaneously in the same process. However, with respect to the switch device having the same structure as that of the switch device as a component of the gate-line driving circuit CVD and the signal-line driving circuit DDV, according to a portion used in the circuit, the size on the layout is properly changed, thereby adjusting the voltage-current conversion efficiency.

Although the device (switch device) shown in FIG. 12 is of the n-type, in practice, a device of the p-type having the same structure is also provided on the same glass substrate 60, as a component of a CMOS circuit. However, it is not shown here for simplicity of the drawing.

By using the configuration of the example, the liquid crystal TFT panel can be easily realized without mounting an Si-LSI in the same manner as the first example. In the case of this example, all active devices can be produced in the same process and there is an advantage such that the number of the processes can be reduced.

Figure 13:
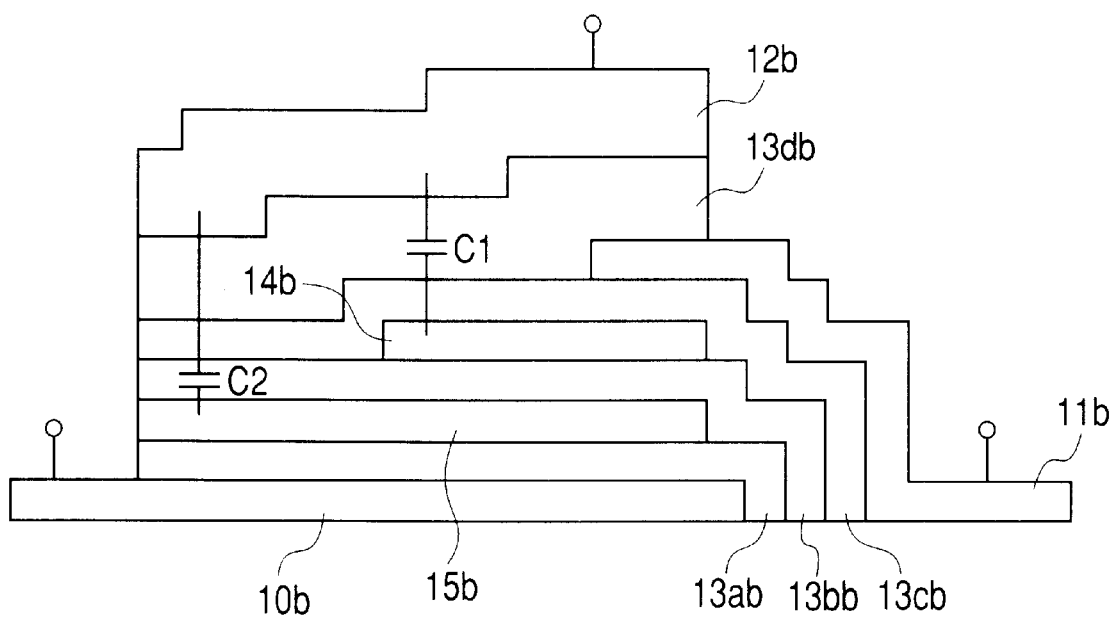
FIG. 13 is a sectional structural diagram showing further another example of the switch device according to the invention.

FIG. 13 is a sectional structural diagram of further another example of the switch device according to the invention. Since the configuration and operation of a TFT liquid crystal panel for which the switch device in the example is used are basically the same as those in the foregoing example, their description will not be repeated here. The difference of this example from the switch device shown in FIG. 1 is that the gate electrode and the island layer are devised as follows.

In FIG. 13, the basic structure and operation of the switch device are the same as those of the switch device in the example of FIG. 1, so that the corresponding components are designated by the same reference numerals to each of which "b" is added and their description will not be repeated.

The difference of the structure of the switch device of the example from that of the switch device shown in FIG. 1 or 4 is that a gate electrode 12b and a poly-Si island 14b construct a gate capacitor C1, and the gate electrode 12b and a poly-Si island 15b construct a gate capacitor C2. Specifically, in the switch device shown in FIGS. 1, 4, or the like, the poly-Si island 15 is not directly capacitive coupled with the gate electrode 12 but is indirectly controlled by the gate electrode 12 via the capacitive coupling (C1+C2) with the poly-Si island 14.

On the other hand, in the switch device of this example, the poly-Si islands 14b and 15b are directly controlled by the gate electrode 12b via the gate capacitors C1 and C2, so that the control on the channel current by the gate voltage is improved, and the amplitude of the gate driving voltage can be decreased. In other words, the parasite capacitance C1 between the gate electrode 12b and the upper poly-Si island 14b and the parasite capacitance C2 between the gate electrode 12b and the lower poly-Si island 15b are constructed in a parallel form, so that the control on the channel current by the gate voltage can be improved. In practice, a small parasitic capacitance exists between each of the poly-Si islands 14b and 15b with another voltage node. By capacitance division with the parasite capacitance, the potential of each of the poly-Si islands 14b and 15b is determined. Consequently, by increasing the value of each of the parasitic capacitances C1 and C2 with the gate electrode 12b, the gate voltage can be transmitted to the poly-Si islands 14b and 15b without a voltage loss.

Figure 14:
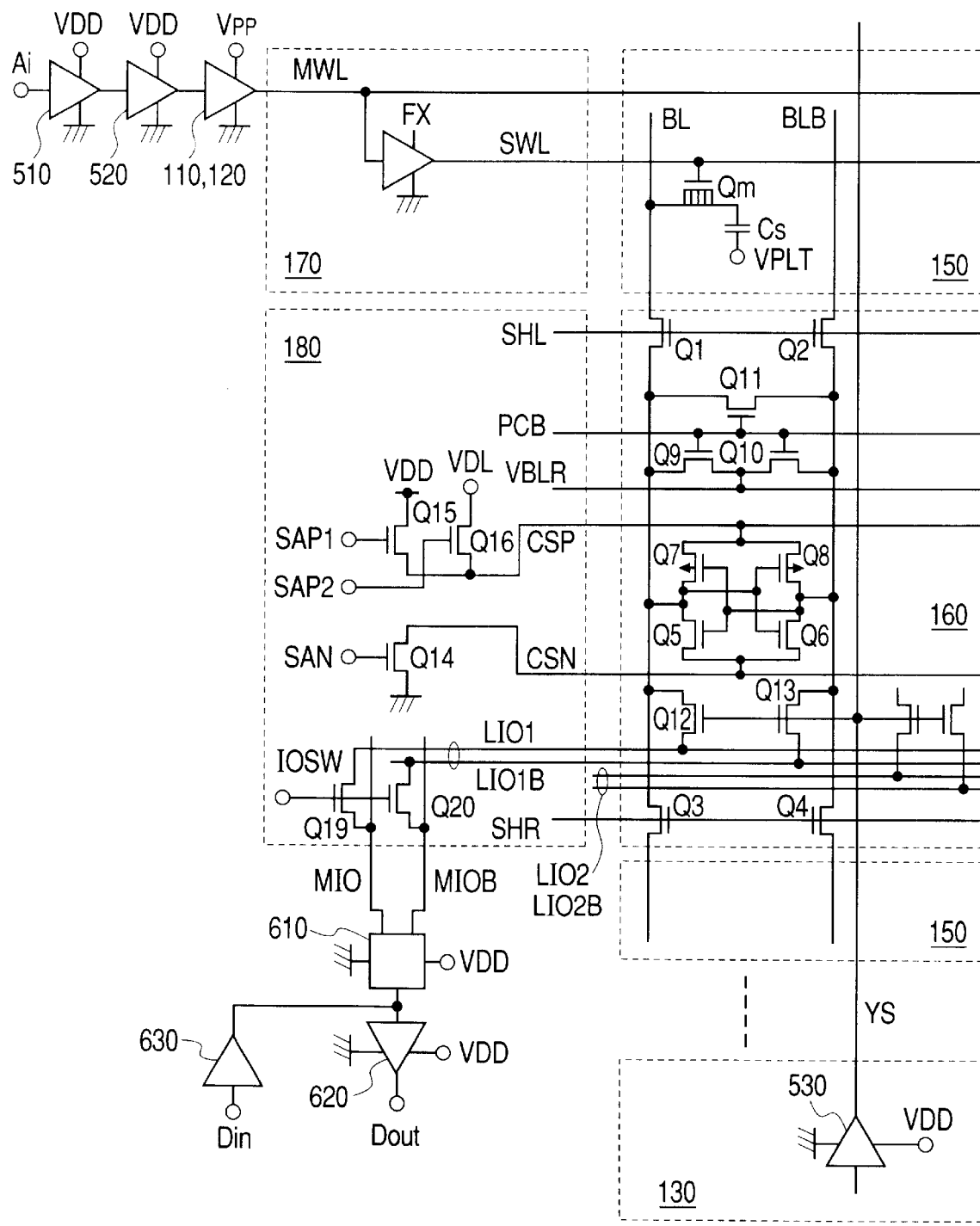
FIG. 14 is a schematic circuit diagram showing an example of a DRAM chip using the switch device according to the invention.
Figure 15:
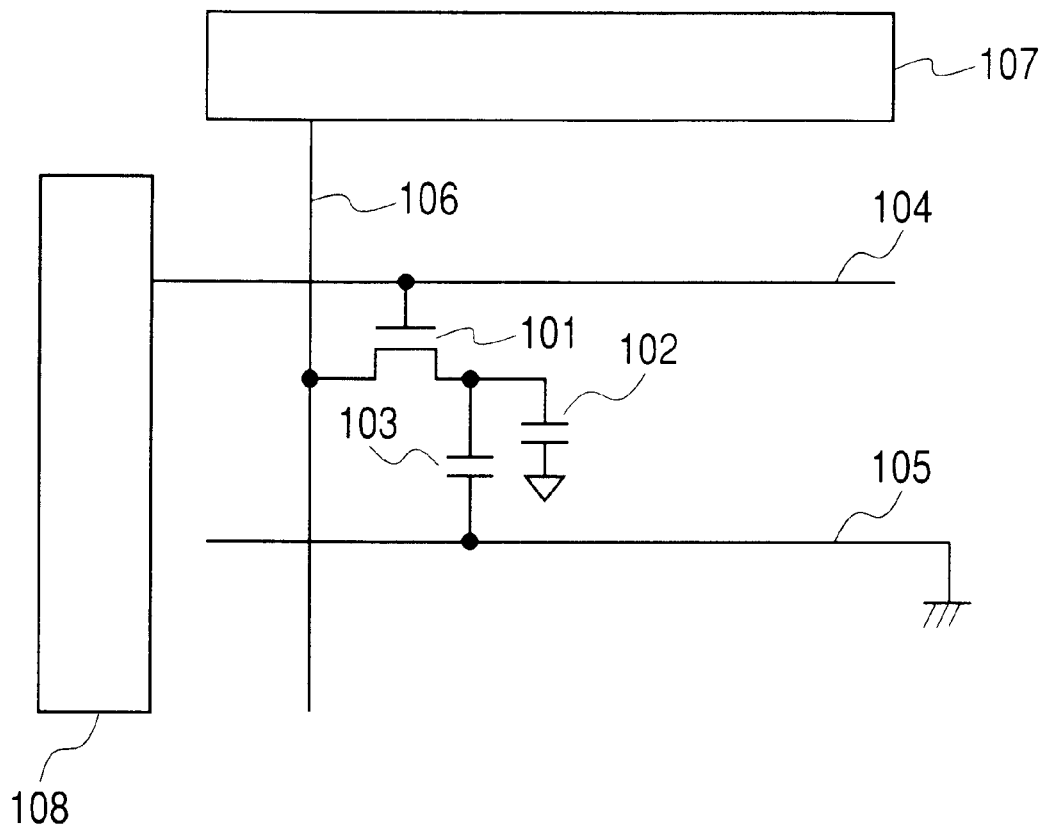
FIG. 15 is a configuration diagram showing an example of a TFT liquid crystal panel according to a conventional technique.
Figure 16:
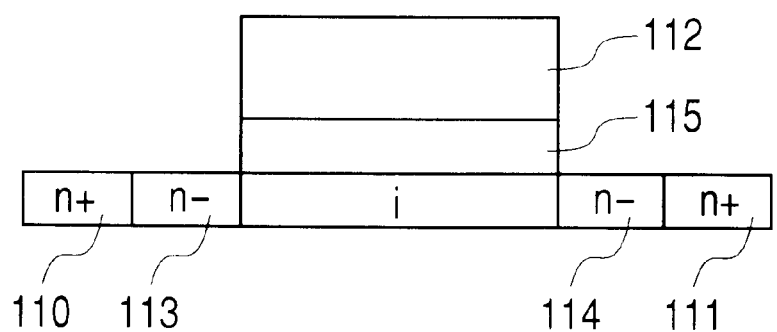
FIG. 16 is a sectional structural diagram showing an example of a polycrystal TFT as a component of a pixel switch according to the conventional technique.
Figure 17:
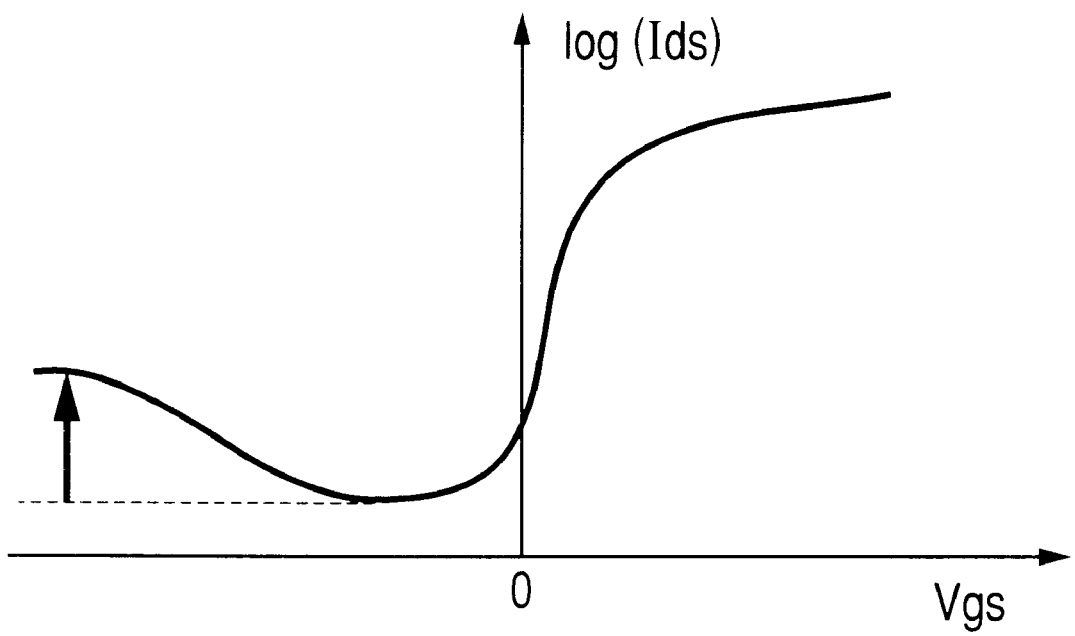
FIG. 17 is a current-voltage characteristic diagram of the polycrystal TFT as a component of the pixel switch according to the conventional technique.

FIG. 14 is a schematic circuit diagram showing an example of a dynamic RAM (hereinbelow, called a DRAM) using the switch device according to the invention. FIG. 14 is a circuit diagram illustrating a simplified portion from address input to data output, while mainly showing a sense amplifier portion.

The DRAM of the example employs what is called a hierarchical word line system constructed by main word lines MWL and sub word lines SWL. Specifically, a circuit diagram shows that, as an example, a memory array is divided into a plurality of portions in the word line direction and the bit line direction, and is provided in a sense amplifier 160 sandwiched by two sub arrays 150 in correspondence with the divided word lines and bit lines and a cross area 180. The other components are shown as blocks.

A dynamic memory cell provided between the sub word line SWL and one, BL, of complementary bit lines BL and BLB in the sub array 150 is illustrated as a representative. The dynamic memory cell is constructed by an address selection switch Qm and a storage capacitor Cs.

As the address selection switch Qm, an MOSFET as in a conventional dynamic RAM is not used but the switch device according to the invention is used. Therefore, the address selection switch Qm is shown in a stripe pattern so as to be discriminated from a normal MOSFET and so as to express that the channel portion between the source and drain has a stack structure of the island layer and the insulating film. The gate of the switch device is connected to the sub word line SWL, the drain of the switch Qm is connected to the bit line BL, and the storage capacitor Cs is connected to the source. The other electrode of the storage capacitor Cs is shared and receives a plate voltage VPLT.

In the case of using the switch device as in the example, the stacked structure is formed on the substrate and, moreover, the channel portion can be easily formed with the stacked structure of the island layer and the insulating film. Since a leak current hardly flows as described above, unlike the case of using a normal MOSFET having a source and drain made by a diffusion layer on a silicon substrate, it is unnecessary to apply a negative back bias voltage VBB to the substrate (channel) in order to reduce the leak current. Thus, a reduced circuit scale and lower power consumption can be achieved. In the example, as MOSFETs other than the address selection switch Qm, MOSFETs formed on the silicon substrate are used.

The selection level of the sub word line SWL is set to a high voltage VPP higher than the high level of the bit line only by a threshold voltage Vth of the address selection switch Qm in order to fully write an information voltage stored in a memory cell.

In the case of operating the sense amplifier by an inner-voltage drop VDP, the high level obtained by being amplified by the sense amplifier and supplied to the bit line is set to the inner voltage VDL level. The high voltage VPP corresponding to the word line selection level is therefore set to VDL+Vth+α. A pair of complementary bit lines BL and BLB of the sub array provided on the left side in the sense amplifier are disposed parallel to each other as shown in the drawing. The complementary bit lines BL and BLB are connected to input and output nodes of a unit circuit of the sense amplifier by shared switch MOSFETs Q1 and Q2.

The unit circuit of the sense amplifier is a CMOS latch circuit including N-channel type amplifier type MOSFETs Q5 and Q6 and P-channel type amplifying type MOSFETs Q7 and Q8 whose gates and drains are cross coupled in a latch form. The sources of the N-channel type MOSFETs Q5 and Q6 are connected to a common source line CSN. The sources of the P-channel type MOSFETs Q7 and Q8 are connected to a common source line CSP. To each of the common source lines CSN and CSP, a power switch MOSFET is connected. Although not limited, an operation voltage corresponding to the ground potential is applied by an N-channel type power switch MOSFET Q14 provided in the cross area 18 to the common source line CSN to which the sources of the N-channel type amplifying MOSFETs Q5 and Q6 are connected.

Although not limited, to the common source line CSP to which the sources of the P-channel type amplifying MOSFETs Q7 and Q8 are connected, an N-channel type power MOSFET Q15 for over driving and an N-channel type power MOSFET Q16 for supplying the inner voltage VDL are provided in the cross area 18. Although not limited, as the voltage for over driving, the source voltage VDD supplied from an external terminal is used. Alternately, in order to lessen the dependency on the source voltage VDD of the sense amplifier operation speed, the voltage may be slightly dropped to obtain the voltage from the source of the N-channel type MOSFET having a gate to which VPP is applied and having a drain to which the source voltage VDD is supplied.

An activate signal SAP1 for sense amplifier overdriving to be supplied to the gate of the N-channel type power MOSFET Q15 has the same phase as that of an activate signal SAP2 to be supplied to the gate of the N-channel type MOSFET Q16. SAP1 and SAP2 are set to the high level in a time sequential manner. Although not limited, the high level of SAP1 and SAP2 is the high voltage VPP level. That is, by using the high voltage VPP, the N-channel type MOSFETs Q15 and Q16 can be sufficiently driven to the on state. After the MOSFET Q15 enters the off state (low level of the signal SAP1) and the MOSFET Q16 enters the on state (high level of the signal SAP2), a voltage corresponding to the inner voltage VDL can be output from the source side.

The input and output nodes of the unit circuit of the sense amplifier are provided with a precharge (equalize) circuit constructed by an equalize MOSFET Q11 for short-circuiting the complementary bit lines and switch MOSFETs Q9 and Q10 for supplying a half precharge voltage VBLR to the complementary bit lines. A precharge signal PCB is commonly supplied to the gates of the MOSFETs Q9 to Q11. An inverter circuit (not shown) is provided in the cross area to make a driver circuit for generating the precharge signal PCB rise or fall at high speed. Specifically, on start of an access to a memory, prior to a word line selecting timing, the MOSFETs Q9 to Q11 constructing the precharge circuit are switched at high speed via the inverter circuits provided so as to be spread in the cross areas.

In the cross area 180, an IO switch circuit IOSW (switch MOSFETs Q19 and Q20 for connecting a local IO and a main IO) is disposed. Further, in addition to the circuits shown in FIG. 14, as necessary, a half precharge circuit of the common source lines CSP and CSN of the sense amplifier, a half precharge circuit of local input/output lines LIO, a VDL precharge circuit of main input/output lines, a distributed driver circuit of shared selection signal lines SHR and SHL, and the like are provided.

The sense amplifier unit circuit is connected to the complementary bit lines BL and BLB of the sub array 150 on the lower side of the drawing via the shared switch MOSFETs Q3 and Q4. For example, when the sub word line SWL in the upper sub array is selected, the upper-side shared switch MOSFETs Q1 and Q2 of the sense amplifier are turned on and the lower-side shared switch MOSFETs Q3 and Q4 are turned off. The switch MOSFETs Q12 and Q13 construct a column (Y) switch circuit which is turned on when the selection signal YS is set to the selection level (high level) to thereby connect the input and output nodes of the sense amplifier unit circuit to local input/output lines LIO1 and LIO1B, LIO2 and LIO2B, and the like of the sense amplifier unit circuit.

Consequently, the input and output nodes of the sense amplifier are connected to the upper-side complementary bit lines BL and BLB to thereby amplify a weak signal of a memory cell connected to the selected sub word line SWL. The amplified signal is transmitted to the local input/output lines LIO1 and LIO1B via the column switch circuit (Q12 and Q13). The local input/output lines LIO1 and LIO1B extend along the sense amplifier column, that is, in the lateral direction of the drawing. The local input and output lines LIO1 and LIO1B are connected to main input/output lines MIO and MIOB to which the input terminals of a main amplifier 610 are connected via an IO switch circuit constructed by the N-channel type MOSFETs Q19 and Q20 provided in the cross area 180.

The IO switch circuit is switched by a selection signal generated by decoding an X address signal. The IO switch circuit may have a CMOS switch configuration in which a P-channel type MOSFET is connected in parallel with each of the N-channel type MOSFETs Q19 and Q20. In a burst mode of a synchronous DRAM, the column selection signal YS is switched by a counter operation. Connection of the local input/output lines LIO1 and LIO1B and LI02 and LIO2B and two pairs of complementary bit lines BL and BLB of the sub array is sequentially switched.

An address signal Ai is supplied to an address buffer 510. The address buffer time-divisionally drives to capture an X address signal and a Y address signal. The X address signal is supplied to a predecoder 520, and a selection signal of the main word line MWL is generated via a main row decoder 110 and a main word driver 120. Since the address buffer 510 receives the address signal Ai supplied from the external terminal, it operates on the source voltage VDD supplied from the external terminal. The predecoder also operates on the source voltage VDD, and the main word driver 120 operates on the high voltage VPP for a conversion. As the main word driver 120, a logic circuit with a level shift function for receiving the predecoded signal is used. A column decoder (driver) 530 receives the Y address signal supplied by time-divisional drive of the address buffer 510 and generates the selection signal YS.

The main amplifier 610 operates on the source voltage VDD, and a signal is output from an external terminal Dout via an output buffer 620 operating on the source voltage VDD supplied from the external terminal. A write signal input from an external terminal Din is captured via an input buffer 630 and is supplied to the main input/output lines MIO and MIOB via a write amplifier (writer driver) included in the main amplifier 610 in the drawing. An input section of the output buffer 620 is provided with a level shifter and a logic unit for outputting an output signal of the level shifter synchronously with a timing signal corresponding to the clock signal.

Although not limited, the source voltage VDD supplied from the external terminal is set to 3.3V in a first mode and the operation voltage VDL of the sense amplifier is set to 1.8V. The word line selection signal (high voltage) is set to 3.6V. The precharge voltage VBLR for a bit line is set to 0.9V corresponding to VDL/2 and the plate voltage VPLT is also set to 0.9V. The source voltage VDD supplied from the external terminal may be set to a low voltage such as 2.5 to 2V as a second mode. In the case of such a low source voltage VDDQ, a low voltage VDL may be set to be equal to the source voltage VDD.

The DRAM of the example is constructed by using, as the address selection device, what is called a tunnel effect transistor according to the invention as described above. With the configuration, a reduced leak current is realized and a refresh rate can be increased. Even when an alpha ray is irradiated and an electron-hole pair is generated in a cell, the tunnel film serves as a stopper against the flow of electron and hole, so that the potential in the cell is not changed. Consequently, it is not impossible to make the DRAM operate as a nonvolatile memory in theory. To a bit line, a source and drain diffusion layer connected as in the case where an address MOSFET is used is not connected. The parasitic capacitance on the bit line can be therefore largely reduced, and a read voltage corresponding to read charges from the memory cell scan be increased. Alternately, a number of memory cells can be connected to a single bit line.

Since the parasitic capacitance on the bit line to which a memory cell is connected decreases as described above, accordingly, the capacitance value of the capacitor for storing information in the memory cell can be smaller, so that a smaller cell size can be realized. Consequently, in the same chip size, the number of storage bits can be increased. Further, by the reduction in the parasitic capacitance on the bit line, the load on the sense amplifier is lightened, so that high-speed reading operation can be also realized and the refresh rate can be largely increased. By the synergy, lower power consumption can be realized.

It is also possible to use the switch device according to the invention in place of the MOSFETs for the peripheral circuits such as the sense amplifier in a manner similar to the memory cell addresss election switch Qm. For an output buffer circuit as well, the same device as that using the switch device according to the invention is used. Since the improved current driving capability can be realized by the device in the invention, the output buffer circuit can be formed in a relatively small device size.

According to the invention, therefore, the output buffer having high current driving capability and a DRAM cell matrix designed at extremely high packing density can be therefore manufactured in the same process. In this case, in place of the silicon substrate, a quartz substrate or a substrate having excellent flatness can be used as a substrate as in an MOSFET.

In the case where storage charges in the storage capacitor are made non-volatile due to reduction in the leak current of the switch device, strictly, the resultant is not a dynamic memory cell. However, since the device configuration of a memory cell constructed by the switch device and the storage capacitor is the same as that of a conventional dynamic memory cell, the memory circuit using such a memory cell is called a DRAM in the specification for convenience.

The actions and effects of the examples are as described below.

(1) An effect such that a high-performance switch device can be obtained is produced. In the switch device, a semiconductor island layer is formed on a first source and drain layer which is a conductive layer. On and under the semiconductor island layer, first insulating films are formed. A second source and drain layer which is a conductive layer and a gate electrode which is made by a conductive layer are formed on the semiconductor island layer via at least a second insulating film. In a first mode, a first voltage is applied to the gate electrode, a potential corresponding to the first potential is applied to the semiconductor island layer via parasitic capacitance formed by the gate electrode and the semiconductor island layer to thereby increase the potential, and a current is passed between the first and second source and drain layers along the direction of an electric field applied to the parasitic capacitance. In a second mode, a second voltage is applied to the gate electrode, a potential corresponding to the second potential is applied to the semiconductor island layer via the parasite capacitance formed by the gate electrode and the semiconductor island layer to thereby decrease the potential, and a current is not substantially passed between the first and second source and drain layers.

(2) In the semiconductor island layer, a first surface portion provided in correspondence with the second source and drain layer and a second surface portion corresponding to the gate electrode are formed. The first insulating film is formed on the first surface portion, and at least the second insulating film is formed on the second surface portion. Consequently, an effect such that the voltage applied to the gate electrode can be efficiently transmitted to the semiconductor island layer and the switch controllability can be increased is obtained.

(3) A plurality of the semiconductor island layers are formed and stacked along the current flowing direction, thereby obtaining an effect such that a leak current in the off state can be further reduced.

(4) In each of the plurality of semiconductor island layers, a first surface portion provided in correspondence with a semiconductor island area to be formed and a second surface corresponding to the gate electrode are provided. The first insulating film is formed on the first surface portion, and at least the second insulating film is formed on the second surface portion. Therefore, an effect such that while further reducing the leak current in the off state, the voltage applied to the gate electrode can be efficiently transmitted to the semiconductor island layer, and the switch controllability can be increased is obtained.

(5) The first insulating film is constructed by a thin insulating film through which a tunneling current flows, the semiconductor island layer is formed to have a thin thickness smaller than an electron mean-free-path, and the second insulating film is constructed by a thick insulating film through which the tunneling current does not flow. With the configuration, an effect such that the operation current in the on state can be increased and the leak current in the off state can be reduced can be obtained.

(6) By using the switch device as an address selection switch and allowing a signal electric carrier to be held in a capacitor via the switch device, an effect such that a memory circuit having excellent data retaining characteristic and excellent memory access characteristic for reading/writing operation can be obtained is produced.

(7) In an image display device including pixel electrodes formed on a flat substrate and arranged in a matrix for forming a liquid-crystal capacitor with a common electrode to which a predetermined voltage is applied, a pixel switch provided for each of the pixel electrodes arranged in the matrix to write a display signal to the pixel electrode, write switch control means for controlling the pixel switch, and display signal input means for writing a display signal to a signal line connected to the pixel switch and provided for each column, in the pixel switch, a semiconductor island layer is formed on the first source and drain layer which is a conductive layer. On and under the first source and drain layer, first insulating films are formed. A second source and drain layer which is a conductive layer and a gate electrode made by a conductive layer formed on the semiconductor island layer at least via a second insulating film are formed. In a first mode, a first potential is applied to the gate electrode, a potential corresponding to the first potential is applied to the semiconductor island layer via parasitic capacitance formed by the gate electrode and the semiconductor island layer to thereby increase the potential, and a current is passed between the first and second source and drain layers along the direction of an electric field applied to the parasitic capacitance. In a second mode, a second potential is applied to the gate electrode, a potential corresponding to the second potential is applied to the semiconductor island layer via the parasitic capacitance formed by the gate electrode and the semiconductor island layer to thereby decrease the potential, and a current is not substantially passed between the first and second source and drain layers. By using such a switch device, a load capacitor for preventing flicker noise or the like caused by the leak current becomes unnecessary and the fill factor of pixels arranged at a high packing density can be increased. Thus, an effect such that an operation of displaying a high-definition high-quality image can be performed is obtained.

(8) Each of the write switch control means and the image signal input means is constructed by a single crystal silicon MOS transistor formed on the flat substrate. With the configuration, the display portion and the driving circuit can be integrally formed. Thus, an effect such that reduction in the number of assembling steps and higher definition can be easily realized is obtained.

(9) Each of the write switch control means and the image signal input means is constructed by a thin film MOS transistor formed on the flat substrate. With the configuration, the display portion and the driving circuit can be integrally formed by using the same process. Thus, an effect such that reduction in the number of manufacturing steps and the number of assembling steps and higher definition can be easily realized is obtained.

(10) In a method of manufacturing an apparatus including a switch device, a semiconductor island layer is formed on a first source and drain layer which is a conductive layer. On and under the semiconductor island layer, first insulating films are formed. A second source and drain layer which is a conductive layer and a gate electrode which is made by a conductive layer are formed on the semiconductor island layer via at least a second insulating film. In a first mode, a first voltage is applied to the gate electrode, a potential corresponding to the first potential is applied to the semiconductor island layer via parasitic capacitance formed by the gate electrode and the semiconductor island layer to thereby increase the potential, and a current is passed between the first and second source and drain layers along the direction of an electric field applied to the parasitic capacitance. In a second mode, a second voltage is applied to the gate electrode, a potential corresponding to the second potential is applied to the semiconductor island layer via the parasite capacitance formed by the gate electrode and the semiconductor island layer to thereby decrease the potential, and a current is not substantially passed between the first and second source and drain layers. In the method, each of the first and second source and drain layers is formed by depositing a polysilicon thin film layer to which a high-concentration impurity is doped by CVD. The first insulating film is formed by: a first step of sequentially stacking an insulating film layer and an amorphous silicon film on the first or second source and drain layer or the semiconductor island layer; a second step of irradiating the amorphous silicon film with a laser beam to thereby convert the amorphous silicon film into a polysilicon film; and a third step of stacking a thin insulating film on the polysilicon film. By the method, an effect such that the film thickness required for each of the films can be excellently controlled even in a large substrate such as a liquid crystal panel.

(11) The first source and drain layer and the second source and drain layer are sequentially stacked and patterned in a lump to thereby form a channel region of the switch device. Consequently, an effect such that the number of patterning steps can be reduced and a foreign matter can be prevented from being adhered to each of the films in the patterning step is produced.

(12) In an apparatus for manufacturing a device including a switch device, a semiconductor island layer is formed on a first source and drain layer which is a conductive layer. On and under the semiconductor island layer, first insulating films are formed. A second source and drain layer which is a conductive layer and a gate electrode which is made by a conductive layer are formed on the semiconductor island layer via at least a second insulating film. In a first mode, a first voltage is applied to the gate electrode, a potential corresponding to the first potential is applied to the semiconductor island layer via parasitic capacitance formed by the gate electrode and the semiconductor island layer to thereby increase the potential, and a current is passed between the first and second source and drain layers along the direction of an electric field applied to the parasitic capacitance. In a second mode, a second voltage is applied to the gate electrode, a potential corresponding to the second potential is applied to the semiconductor island layer via the parasite capacitance formed by the gate electrode and the semiconductor island layer to thereby decrease the potential, and a current is not substantially passed between the first and second source and drain layers. Each of the first and second source and drain layers is formed by depositing a polysilicon thin film layer to which a high-concentration impurity is doped by CVD. The first insulating film is formed by: a first step of sequentially stacking an insulating film layer and an amorphous silicon film on the first or second source and drain layer or the semiconductor island layer; a second step of irradiating the amorphous silicon film with a laser beam to thereby convert the amorphous silicon film into a polysilicon film; and a third step of stacking a thin insulating film on the polysilicon film. The manufacturing apparatus is used for the above manufacturing method. Input/output ports of CVD systems corresponding to the steps and a laser exposure instrument are coupled to a common chamber so as to perform processes continuously until the second source and drain film is stacked without substantially exposing the device to atmosphere. Thus, an effect such that each of the films can be manufactured with high controllability even on a large substrate such as a liquid crystal panel is obtained.

Although the invention achieved by the inventor herein has been concretely described on the basis of the examples, obviously, the invention is not limited to the examples but can be variously modified within a range not departing from the gist. For example, any device pattern of the switch device may be used as long as the stack structure as described above is used. To increase the capacitance value of the parasitic capacitance between the gate electrode and the island layer, it is also possible to remove the thin first insulating film in a portion overlapped with the gate electrode and form a relatively thick second insulating film. However, as described above, the first insulating film is much thinner than the second insulating layer. Consequently, even when the thickness of the second insulating film is determined on precondition of the first insulating film, a similar effect can be produced. The gate electrode may be formed on a flat substrate. Specifically, in FIG. 1, it is possible to arrange the source and drain SD1 and the gate electrode via an insulating film and, on them, stack the first insulating film, the island layer, and the source and drain SD2. The switch device according to the invention can be widely used for an image display panel and a memory circuit as described above and as a switch device.

Industrial Applicability

The invention can be widely applied to a semiconductor device including a memory circuit in which a switch device is formed, an image display device using the semiconductor device as a pixel switch, and method and apparatus for manufacturing the image display device.

What is claimed is:

1. A semiconductor device comprising:

a first conductive layer which functions as a source or drain;

a semiconductor island layer formed over said first conductive layer, wherein a first insulating film is formed between said first conductive layer and said semiconductor island layer;

a second conductive layer which functions as a source or drain formed over said semiconductor island layer, wherein a second insulating film is formed between said second conductive layer and said semiconductor island layer; and a gate electrode which is a conductive layer formed over said semiconductor island layer on a gate insulating film formed on said second insulating film, wherein in a first mode in which a first potential is applied to said gate electrode, a potential corresponding to said first potential is applied to said semiconductor island layer via parasitic capacitance formed by said gate electrode and said semiconductor island layer to thereby increase said semiconductor island layer potential, and a current is passed between said first and second conductive layers through said semiconductor island layer, said first insulating film and said second insulating film along a direction of an electric field applied between said gate electrode and said semiconductor island area, and in a second mode in which a second potential is applied to said gate electrode, a potential corresponding to said second potential is applied to said semiconductor island layer via a parasitic capacitance formed by said gate electrode and said semiconductor island layer to thereby decrease said semiconductor island layer potential, and a current is substantially inhibited from passing between said first and second conductive layers through said semiconductor island layer, said first insulating film and said second insulating film.

2. The semiconductor device according to claim 1, wherein said semiconductor island layer has a first surface portion and a second surface portion on a same plane, wherein said first surface portion is in register with a portion of said second conductive layer and said a second surface portion is in register with a portion of said gate electrode, said second insulating film is formed on at least said first surface portion, and at least a portion of said gate insulating film is formed in register with said second surface portion.

3. The semiconductor device according to claim 1, wherein a plurality of said semiconductor island layers are formed by being stacked along said direction of said electric field.

4. The semiconductor device according to claim 3, wherein a semiconductor island layer of said plurality of semiconductor island layers is positioned closest to said second conductive layer and said gate electrode and has a first surface portion in register with a portion of said second semiconductor layer and a second surface portion in register with a portion of said gate electrode, said second insulating film is formed on at least said first surface portion, and at least a portion of said gate insulating film is formed in register with on said second surface portion.

5. The semiconductor device according to claim 1, wherein said first and second insulating films are thin insulating films through which a tunneling current can flow, said semiconductor island layer has a thickness less than an electron mean free path therein, and said gate insulating film is a thick insulating film through which no substantial tunneling current can flow.

6. The semiconductor device according to claim 5, wherein said first conductive layer of said semiconductor device is connected to a bit line extended in a first direction, and said second conductive layer is connected to one electrode of a storage capacitor to the other electrode of which a predetermined potential is applied, and said gate electrode is connected to a word line extended in a second direction orthogonal to said bit line and serves as a component of a memory cell.

7. An image display device comprising pixel electrodes formed on a flat substrate and arranged in a matrix for forming a liquid-crystal capacitor with a common electrode formed to which a predetermined voltage is applied, a pixel switch provided for each of said pixel electrodes arranged in the matrix to write a display signal to said pixel electrode, write switch control means for controlling said pixel switch, a signal line connected to said pixel switch and provided for each column, and display signal input means for writing a display signal onto said signal line, wherein said pixel switch comprises:
a first conductive layer which functions as a source or drain and is formed on a surface of said flat substrate and connected to said signal line;
a semiconductor island layer formed over said first conductive layer, wherein a first insulating film is formed between said first conductive layer and said semiconductor island layer;
a second conductive layer which functions as a source or drain formed over said semiconductor island layer and connected to said pixel electrode, wherein a second insulating film is formed between said second conductive layer and said semiconductor island layer; and
a gate electrode which is a conductive layer formed over said semiconductor island layer on a gate insulating film formed on said second insulating film, and is connected to said write switch control means, wherein in a first mode in which a first potential is applied to said gate electrode by said write switch control means, a potential corresponding to said first potential is applied to said semiconductor island layer via parasitic capacitance formed by said gate electrode and said semiconductor island layer to thereby increase said semiconductor island layer potential, and a current is passed between said first and second conductive layers through said semiconductor island layer, said first insulating film and said second insulating film along a direction of an electric field applied between said gate electrode and said semiconductor island layer, and in a second mode in which a second potential is applied to said gate electrode by said write switch control means, a potential corresponding to said second potential is applied to said semiconductor island layer via the parasitic capacitance formed by said gate electrode and said semiconductor island layer to thereby decrease said semiconductor island layer potential, and a current is substantially inhibited from passing between said first and second conductive layers through said semiconductor island layer, said first insulating film and said second insulating film.

8. The image display device according to claim 7, wherein each of said write switch means and said image signal input means is constructed by a single crystal silicon MOS transistor formed on said flat substrate.

9. The image display device according to claim 7, wherein each of said write switch means and said image signal input means is constructed by a thin film MOS transistor formed on said flat substrate.

10. A method of manufacturing a switch device comprising:

a first step of forming a first layer of polycrystalline silicon on a substrate, said first polycrystalline layer being conductive and doped with an impurity;

a second step of forming a first thin insulating film on said first polycrystalline silicon layer;

a third step of forming an amorphous silicon layer on said first thin insulating film and then irradiating said amorphous silicon layer with a laser beam to thereby convert said amorphous silicon layer into a second polycrystalline silicon layer;

a fourth step of forming a second thin insulating film on said second polycrystalline silicon layer;

a fifth step of forming a third polycrystalline silicon layer on said second thin insulating film, said third polycrystalline silicon layer being conductive and doped with an impurity;

a sixth step of patterning said first polycrystalline silicon layer, said first thin insulating film, said second polycrystalline silicon layer, said second insulating film and said third polycrystalline silicon layer by dry etching using a single mask;

a seventh step of removing part of said third polycrystalline silicon layer to expose at least a portion of said second thin insulating film;

an eighth step of forming a gate insulating film on said exposed portion of said second thin insulating film; and a ninth step of forming a gate electrode on said gate insulating film.

11. The method of manufacturing a switch device according to claim 10, wherein each of said first and second thin insulating films is a silicon nitride film.

12. The semiconductor device according to claim 4, wherein said first and second insulating films are thin insulating films through which a tunneling current can flow, said semiconductor island layer has a thickness less than an electron mean free path therein, and said gate insulating film is a thick insulating film through which no substantial tunneling current can flow.

13. The semiconductor device according to claim 12, wherein said first conductive layer of said semiconductor device is connected to a bit line extended in a first direction, and said second conductive layer is connected to one electrode of a storage capacitor to the other electrode of which a predetermined potential is applied, and said gate electrode is connected to a word line extended in a second direction orthogonal to said bit line and serves as a component of a memory cell.

* * * * *